United States Patent
Lu et al.

(10) Patent No.: US 10,872,788 B2
(45) Date of Patent: Dec. 22, 2020

(54) WET ETCH APPARATUS AND METHOD FOR USING THE SAME

(71) Applicant: TAIWAN SEMICONDUCTOR MANUFACTURING CO., LTD., Hsinchu (TW)

(72) Inventors: Hong-Ting Lu, Taichung (TW); Han-Wen Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/542,119

(22) Filed: Aug. 15, 2019

(65) Prior Publication Data

US 2020/0168480 A1 May 28, 2020

Related U.S. Application Data

(60) Provisional application No. 62/771,492, filed on Nov. 26, 2018.

(51) Int. Cl.
| | |
|---|---|
| *H01L 21/67* | (2006.01) |
| *H01L 21/306* | (2006.01) |
| *H01L 29/66* | (2006.01) |
| *H01L 29/08* | (2006.01) |

(52) U.S. Cl.
CPC .... *H01L 21/6708* (2013.01); *H01L 21/30604* (2013.01); *H01L 29/6656* (2013.01); *H01L 29/66545* (2013.01); *H01L 29/66795* (2013.01); *H01L 21/67051* (2013.01); *H01L 29/0847* (2013.01)

(58) Field of Classification Search
None
See application file for complete search history.

(56) References Cited

U.S. PATENT DOCUMENTS

| | | | | |
|---|---|---|---|---|
| 5,415,728 A | * | 5/1995 | Hasegawa | H01J 37/3244 438/710 |
| 2013/0200468 A1 | | 8/2013 | Cai et al. | |
| 2013/0320477 A1 | * | 12/2013 | Ohmi | H01L 31/0248 257/447 |

FOREIGN PATENT DOCUMENTS

CN 202830170 U 3/2013

* cited by examiner

*Primary Examiner* — Steven B Gauthier
(74) *Attorney, Agent, or Firm* — Maschoff Brennan

(57) ABSTRACT

A method includes dispensing a liquid etchant onto a wafer, wherein the wafer is free from rotation during dispensing the liquid etchant; blowing the liquid etchant on the wafer using a gas flow, wherein a direction of the gas flow remains substantially constant during dispensing the liquid etchant; and turning the gas flow off after a target structure on the wafer is etched away by the liquid etchant.

20 Claims, 16 Drawing Sheets

WET ETCH APPARATUS AND METHOD FOR USING THE SAME

PRIORITY CLAIM AND CROSS-REFERENCE

This application claims priority to U.S. Provisional Application Ser. No. 62/771,492, filed Nov. 26, 2018, which is herein incorporated by reference.

BACKGROUND

A process of manufacturing semiconductor devices involves a wide variety of steps. For example, a layer formation process may be included in the process, in which multiple layers such as a polycrystalline layer, an oxide layer, a nitride layer, a metal layer, etc. are formed on a wafer as a semiconductor substrate. These steps generally also include a diffusion process, a photolithography process, an etching process, a cleaning process, an ion implantation process, and the like, which are carried out between the steps of layer formation. Etching is a process in which selected material is removed from a silicon substrate or from thin films on the substrate surface. Etching can be performed through wet etching using a wet chemical. That is, in a wet etching process, the substrate is etched through exposure to a liquid etchant. The liquid etchant removes a predetermined amount of a selected material and thereby forms patterns in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
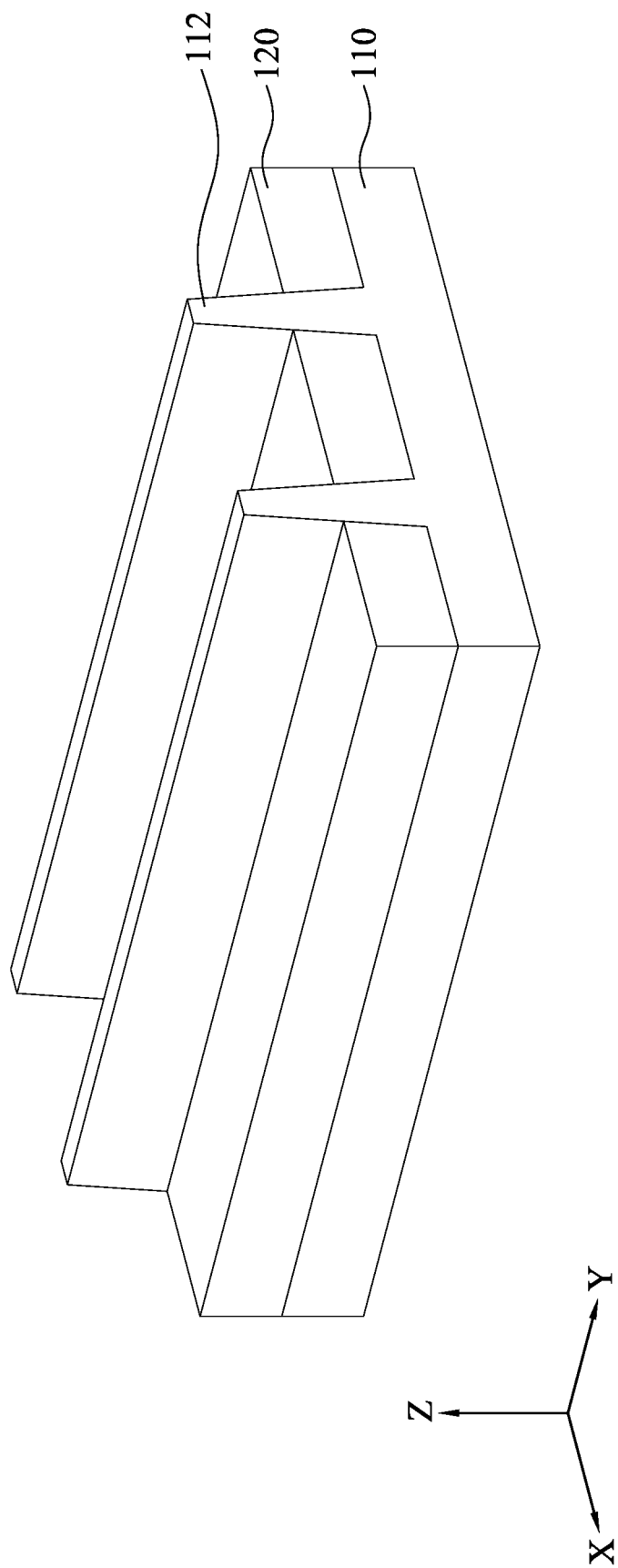
FIGS. 1-11 illustrate perspective views of a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

Wet etch is a process that uses a chemical solution, which contains liquid etchants, to remove materials from the surface of a target such as, for example, a wafer. A wet etch process can involve multiple chemical reactions that consume the original reactants and produce new reactants and byproducts. The wet etch process can be divided into three steps: (1) diffusion of the liquid etchant to the "target" material; (2) reaction between the liquid etchant and the target material; and (3) diffusion of the byproducts in the solution, away from the surface where the reaction occurred. Wet etch processes are used in chip manufacturing at various wafer fabrication stages to selectively remove materials from the wafer's surface. For example, a wet etch process can be used to remove polycrystalline silicon (polysilicon) from a sacrificial gate structure so that it can be replaced with a metal gate.

FIGS. 1-11 illustrate perspective views of a method of manufacturing a semiconductor device at various stages in accordance with some embodiments. Reference is made first to FIG. 1. A substrate 110 including plural semiconductor fins 112 is provided. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110 in a P-well structure, in an N-well structure, in a dual-well structure, and/or using a raised structure. The substrate 110 may further include various active regions, such as regions configured for an N-type metal-oxide-semiconductor transistor device and regions configured for a P-type metal-oxide-semiconductor transistor device.

The semiconductor fins 112 may be formed by any suitable method. For example, the semiconductor fins 112 may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate 110 and patterned using a photolithography process. Spacers are formed alongside the patterned sacrificial layer using a self-aligned process. The sacrificial layer is then removed, and the remaining spacers may then be used to pattern the fins.

A plurality of isolation structures 120 are formed over the substrate 110 and adjacent to the semiconductor fins 112. The isolation structures 120, which act as a shallow trench isolation (STI) around the semiconductor fins 112, may be formed by chemical vapor deposition (CVD) techniques using tetra-ethyl-ortho-silicate (TEOS) and oxygen as a precursor. In some other embodiments, the isolation structure 120 comprises insulator layers of an SOI wafer.

Figure 2:
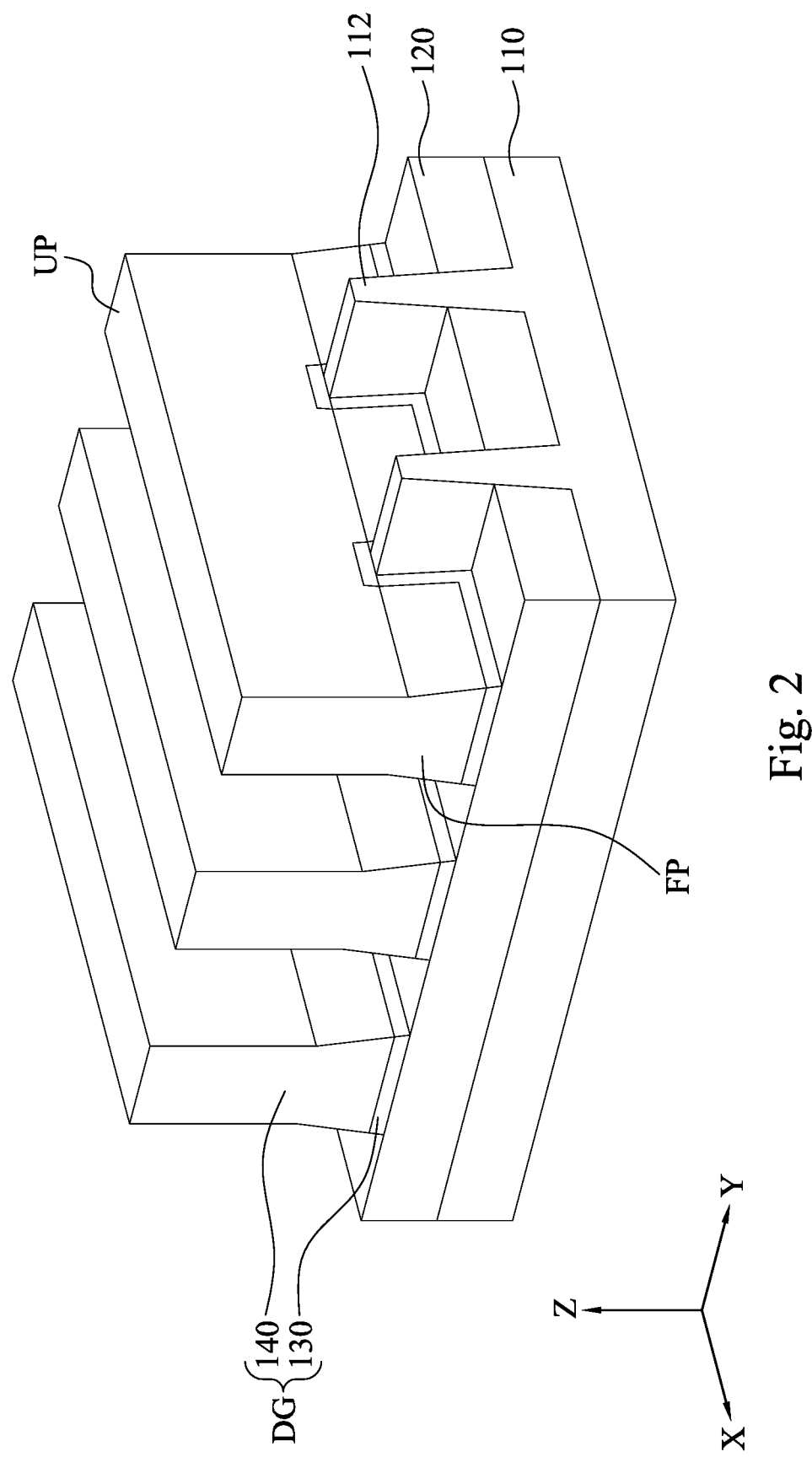

Reference is made to FIG. 2. A plurality of dummy gate stacks DG are formed around the semiconductor fins 112 of the substrate 110. In some embodiments, each of the dummy gate stacks DG includes a dummy gate electrode 140 and a gate dielectric layer 130 underlying the dummy gate electrode 140. The dummy gate electrodes 140 may include polycrystalline-silicon (poly-Si) or poly-crystalline silicon-germanium (poly-SiGe). Further, the dummy gate electrodes 140 may be doped poly-silicon with uniform or non-uniform doping. In some embodiments, the gate dielectric layer 130 is a silicon oxide layer that forms an interface with the underlying semiconductor fin 112, and therefore the gate dielectric layer 130 can be interchangeably referred to as an interfacial layer in some embodiments.

In some embodiments, the dummy gate stacks DG may be formed by, for example, forming a stack of a gate dielectric layer and a dummy gate material layer over the substrate 110, followed by patterning the gate dielectric layer and the dummy gate material layer using one or more etching processes, such as one or more dry plasma etching processes or one or more wet etching processes. A patterned mask is formed over the stack of the gate dielectric layer and the dummy gate material layer to act as an etch mask for the patterning process. At least one process condition, such as an etchant, an etching temperature, an etching solution concentration, an etching pressure, a source power, a radio frequency (RF) bias voltage, and/or an etchant flow rate, of the patterning (or etching) recipe can be tuned. For example, a dry etching process, such as plasma etching, may be used to etch the dummy gate material layer and the gate dielectric layer until the semiconductor fins 112 are exposed. Due to nature of the etching process, the dummy gate stacks DG each have upper portions UP having substantially straight sidewalls and tapered foot portions FP that taper in a direction away from the STI 120 (i.e., in an upward direction). Stated differently, the tapered foot portions FP have widths that decrease as a distance from the STI 120 increases.

Figure 3:
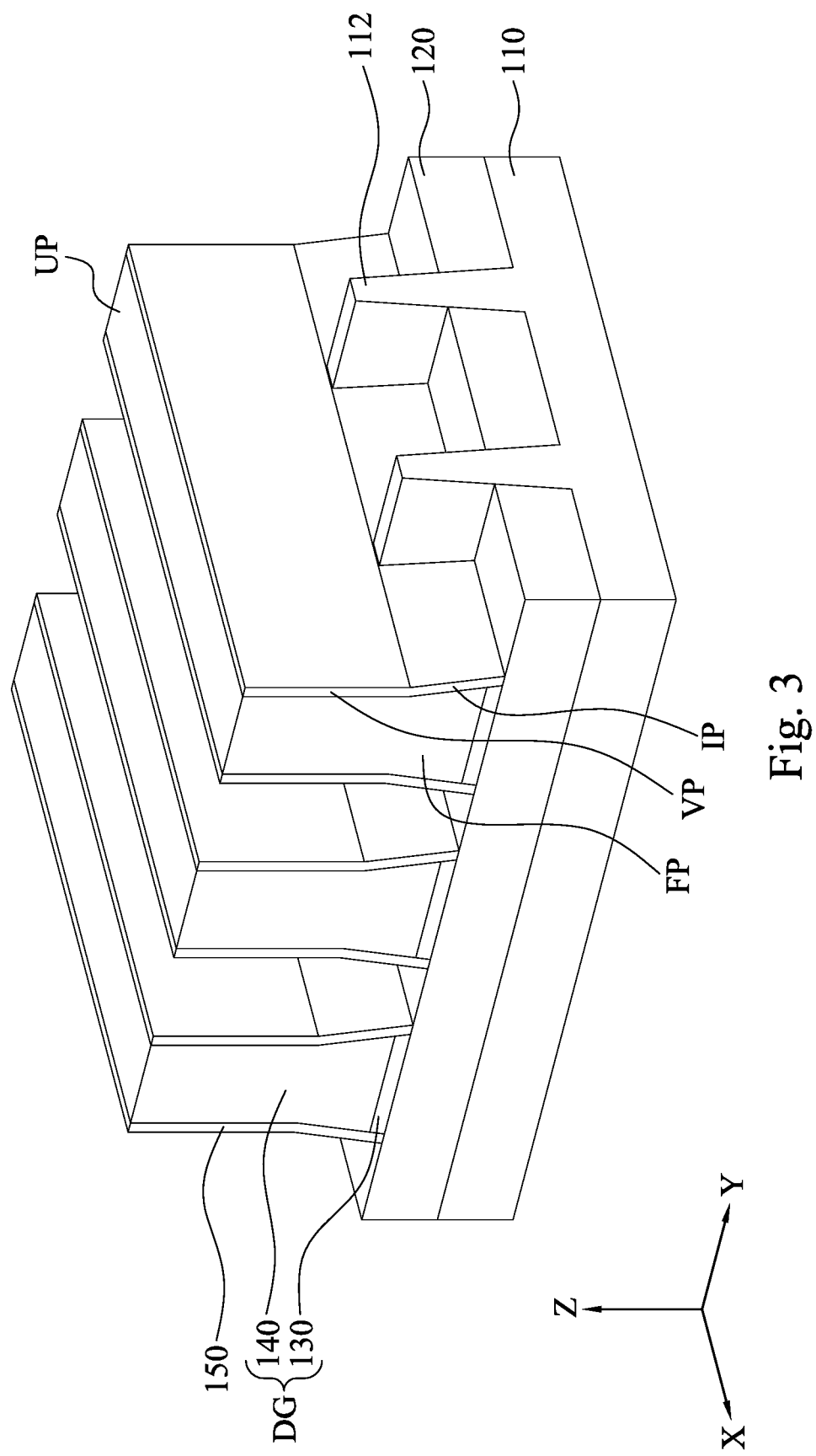

Reference is made to FIG. 3. A plurality of gate spacers 150 are formed respectively on opposite sidewalls of the dummy gate stacks DG. In some embodiments, at least one of the gate spacers 150 includes single or multiple layers. The gate spacers 150 can be formed by blanket depositing one or more conformal dielectric layers on the structure shown in FIG. 2, followed by performing anisotropic etching to remove horizontal portions of the one or more dielectric layers, and remaining portions of the one or more dielectric layers are referred to as the gate spacers 150. The one or more dielectric layers may include silicon nitride (SiN), oxynitride, silicon oxynitride (SiON), oxide, and the like. Because of the conformal deposition, the gate spacers 150 each include a substantially vertical portion VP extending alongside the upper portion UP of the dummy gate stack DG and an inclined portion IP extending alongside the tapered foot portion FP of the dummy gate stack DG. As a result, the inclined portions IP are inclined with respect to the vertical portions VP.

Figure 4:
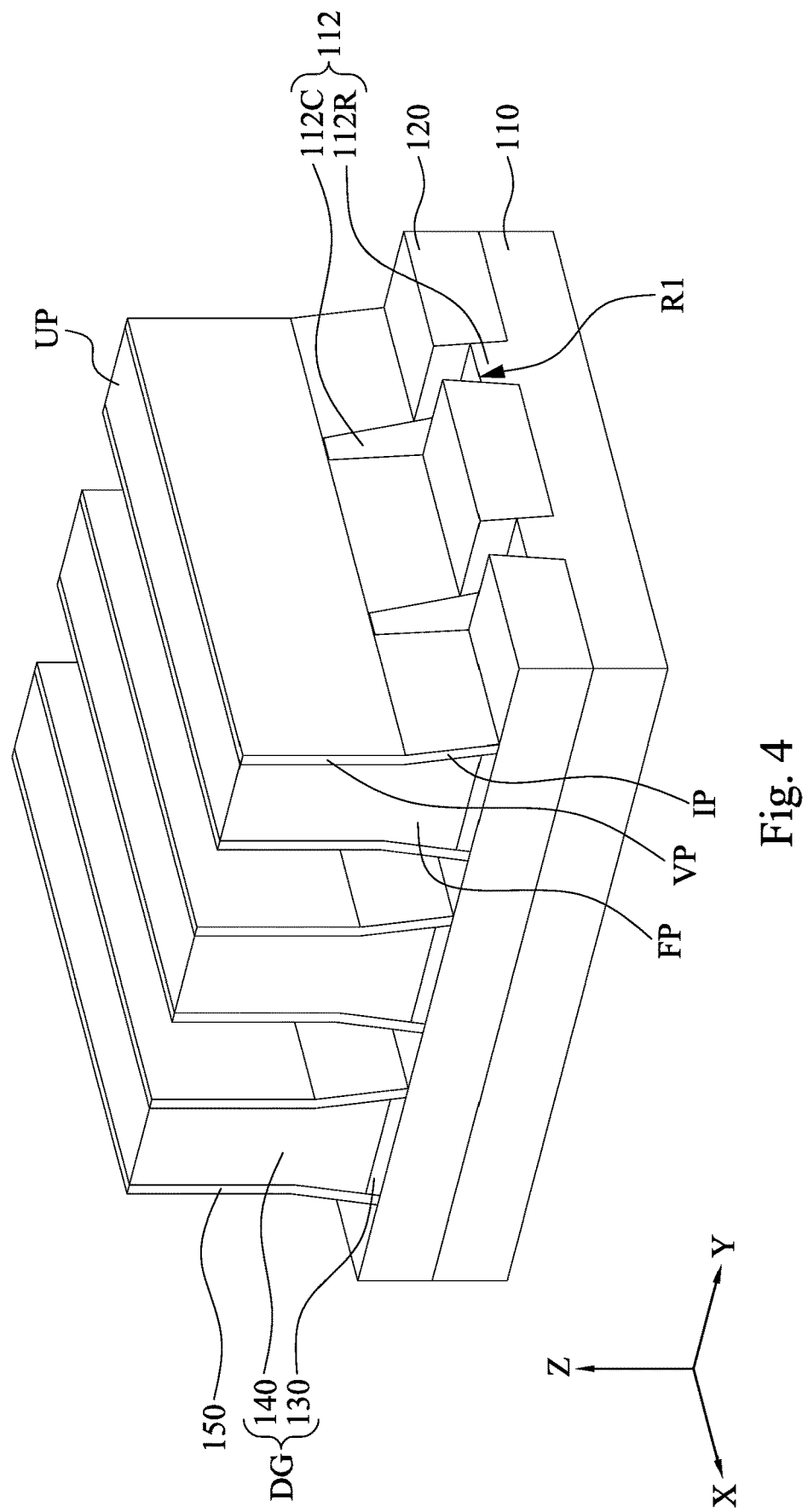

Reference is made to FIG. 4. Portions of the semiconductor fins 112 uncovered by the dummy gate stacks DG and the gate spacers 150 are removed, such that the resultant semiconductor fins 112 include recessed portions 112R uncovered by the dummy gate stacks DG and the gate spacers 150 and channel portions 112C covered by the respective dummy gate stacks DG.

Recessing the semiconductor fins 112 may include a dry etching process, a wet etching process, or combination of dry and wet etching processes. The recessing process may also include a selective wet etch or a selective dry etch. For example, a wet etching solution may include $NH_4OH$, potassium hydroxide (KOH), hydrofluoric acid (HF), tetramethylammonium hydroxide (TMAH), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as deep reactive-ion etching (DRIE). In some embodiments, the recesses R1 can be formed using an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve a predetermined recess profile. After the etching process, a pre-cleaning process may be performed to clean the recesses R1 with hydrofluoric acid (HF) or another suitable solution in some embodiments.

Figure 5:
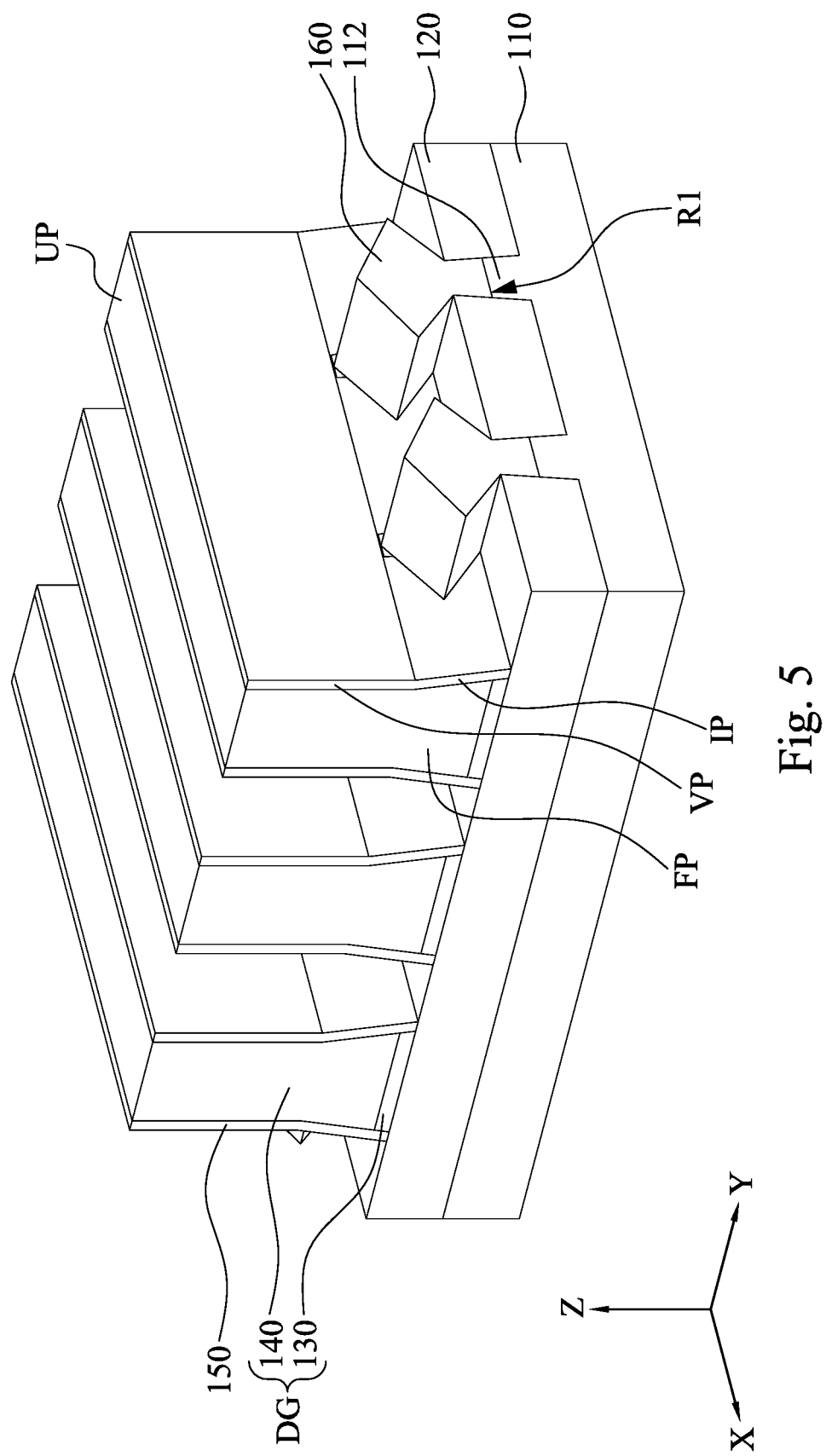

Reference is made to FIG. 5. A plurality of source/drain features 160 are respectively formed in the recesses R1 of the semiconductor fins 112 of the substrate 110. At least one of the source/drain features 160 may be formed between the dummy gate stacks DG. The source/drain features 160 may be formed using one or more epitaxy or epitaxial (epi) processes, such that Si features, SiGe features, and/or other suitable features can be formed in a crystalline state on the semiconductor fins 112. The source/drain features 160 can be interchangeably referred to as epitaxy features. In some embodiments, lattice constants of the source/drain features 160 are different from lattice constants of the semiconductor fins 112, such that the channel portions 112C (as shown in FIG. 4) of the semiconductor fins 112 are strained or stressed to enhance carrier mobility of the semiconductor device and thus enhance the device performance. In some embodiments, the source/drain features 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy processes may use gaseous and/or liquid precursors, which interact with the composition of the semiconductor fins 112 (e.g., silicon). The source/drain features 160 may be in-situ doped. The doping species include P-type dopants, such as boron or $BF_2$; N-type dopants, such as phosphorus or arsenic; and/or other suitable dopants including combinations thereof. If the source/drain features 160 are not in-situ doped, a second implantation process (i.e., a junction implant process) is performed to dope the source/drain features 160. One or more annealing processes may be performed to activate the doped source/drain features 160. The annealing processes include rapid thermal annealing (RTA) and/or laser annealing processes.

Figure 6A:
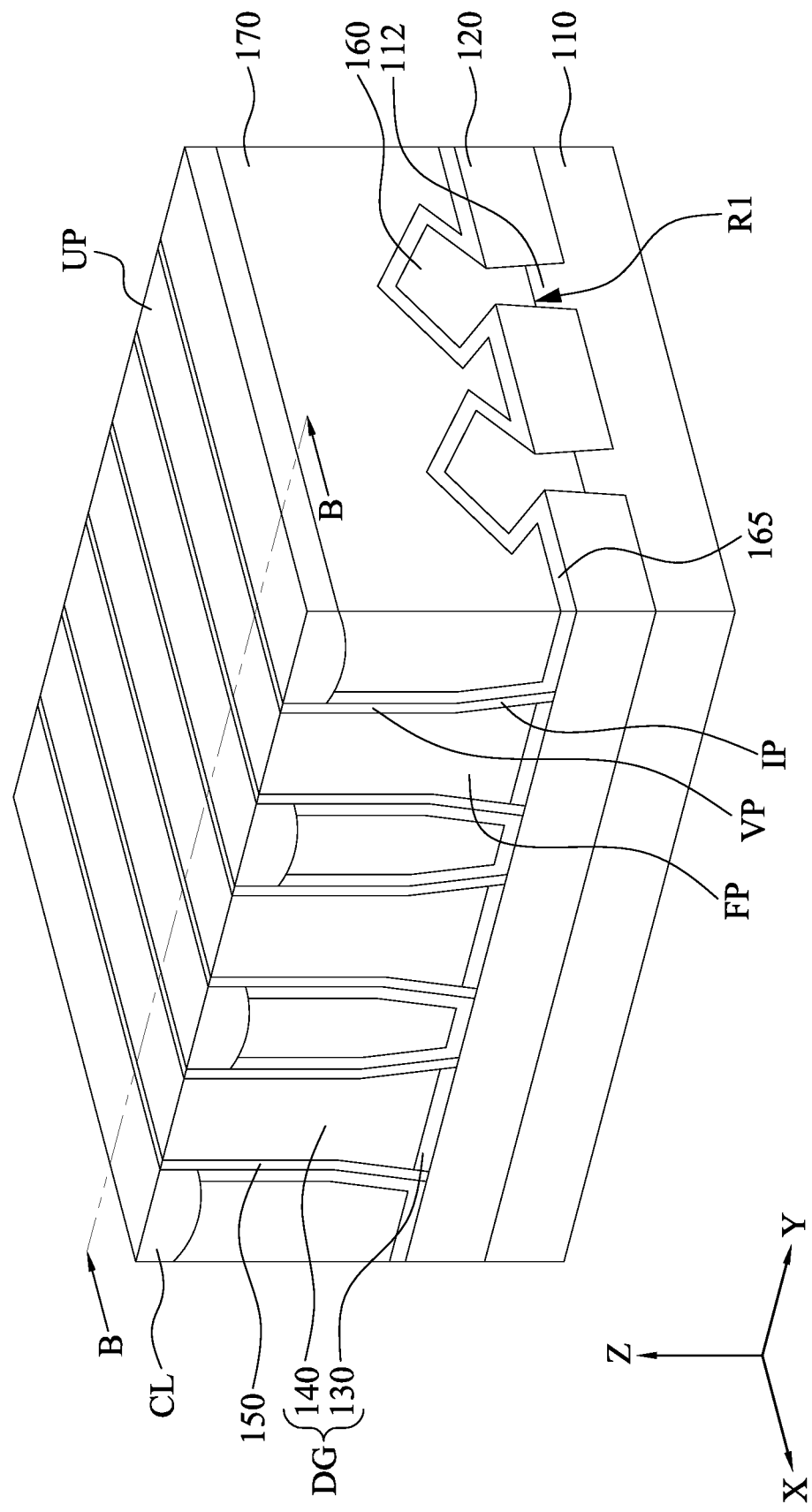
Figure 6B:
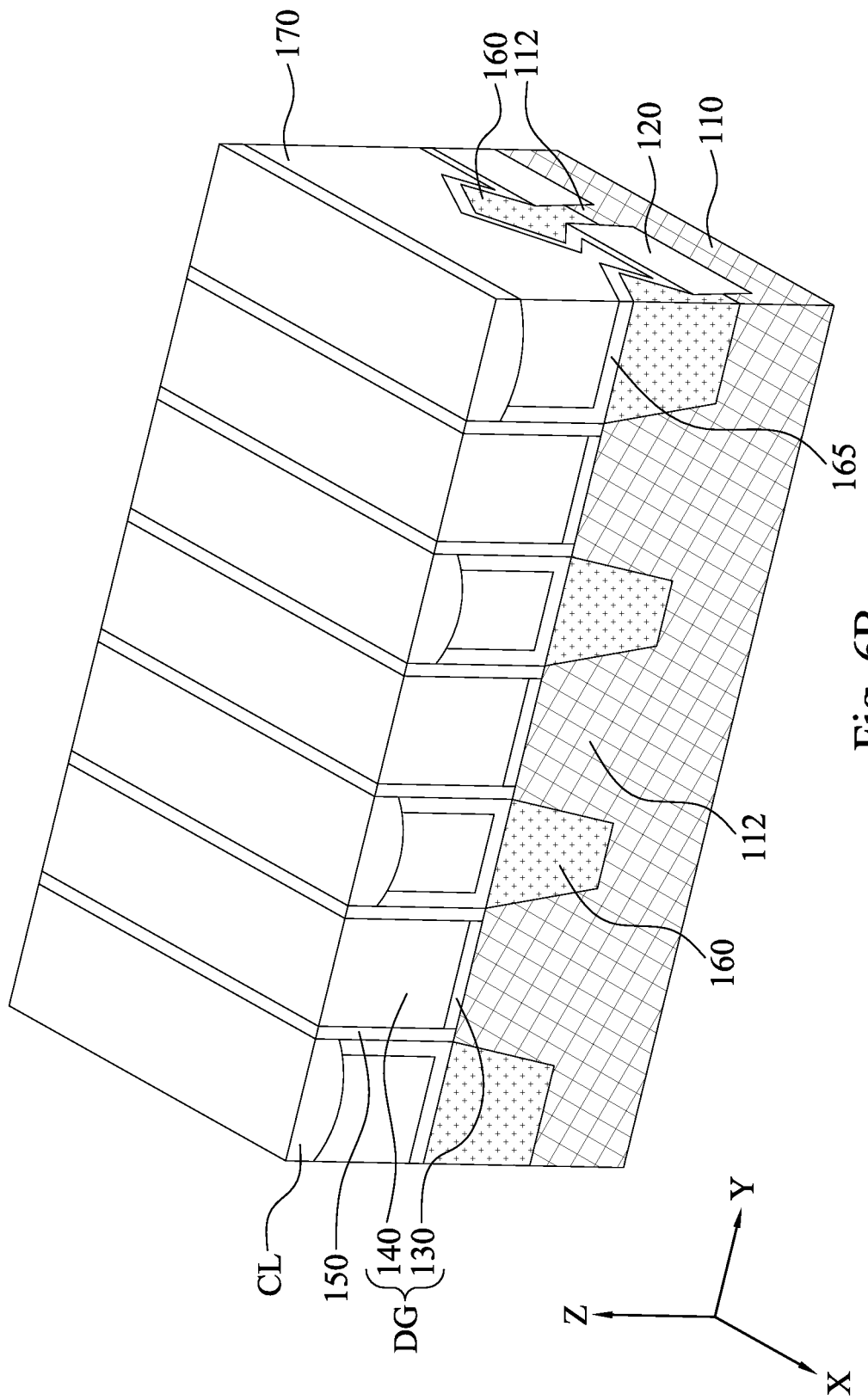

Reference is made to FIGS. 6A and 6B. FIG. 6B is a cross-sectional perspective view obtained from the vertical plane containing line B-B in FIG. 6A. Unless specified otherwise, the cross-sectional perspective views in subsequent figures may also be obtained from planes same as the vertical plane containing line B-B in FIG. 6A. After the source/drain features 160 are formed, a contact etch stop layer (CESL) 165 and an interlayer dielectric (ILD) layer 170 are deposited in sequence over the substrate 110, followed by performing a chemical mechanical polishing (CMP) process on the ILD layer 170 and the CESL 165 until the dummy gate stacks DG are exposed. The CESL 165 includes a nitride-based material, such as SiN, SiON, or the like. The ILD layer 170 may include a different material than the CESL 165. For example, the ILD layer 170 includes an oxide-based material such as silicon oxide or other suitable oxide materials. The ILD layer 170 includes a single layer or multiple layers. In some embodiments, the ILD 170 may be covered by a capping layer CL. The capping layer CL may be made of silicon nitride (SiN), silicon oxycarbide (SiOC), silicon oxycarbonitride (SiOCN), or the combination thereof. For example, a portion of the ILD layer 170 and a portion of the CESL 165 are removed to form recesses, and the capping layer CL is formed over the remaining ILD layer 170, and fills the recesses.

Figure 9:
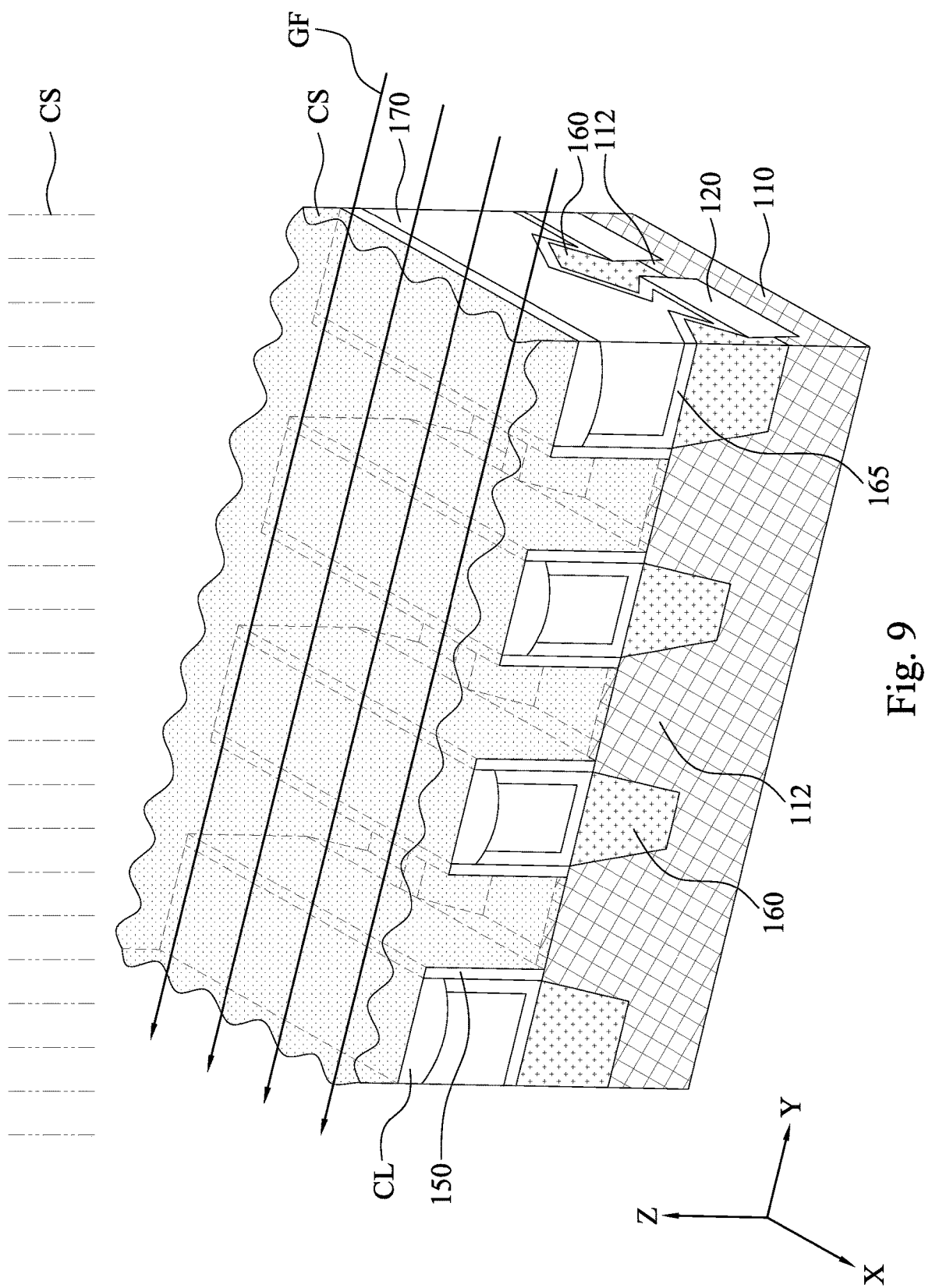

Subsequently, one or more etch processes are performed to remove the dummy gate electrodes 140 for replacing the dummy gate electrodes 140 with metal in a following step (i.e., gate replacement process). The one or more etch processes may include a wet etch or a combination of a wet etch and a selective dry etch. The etch processes include dispensing a chemical solution containing a liquid etchant onto a wafer including the substrate 110. In some embodiments, the gate spacers 150 have higher etch resistance to the liquid etchant than that of the dummy gate electrodes 140, so that the gate spacers 150 can protect sidewalls of the source/drain features 160 from being etched. During some wet etch processes, the substrate 110 would be spun to spread out the chemical solution toward circumference of the substrate 110 by centrifugal forces toward circumference of the substrate 110. If the liquid etchant removes the gate dielectric layer 130 intentionally or unintentionally, the semiconductor fins 112 would be inevitably soaked in the liquid etchant (as illustrated in FIG. 9). However, spinning the substrate 110 during the wet etching would lead to a centrifugal motion of the liquid etchant, which in turn would impinge on the sidewalls of the soaked fins 112, thus undesirably etching the soaked fins 112. Moreover, if the liquid etchant etches into the fins 112 and then arrives at the source/drain features 160, the source/drain features 160 might be damaged and hence the wafer yield might be degraded.

Figure 12:
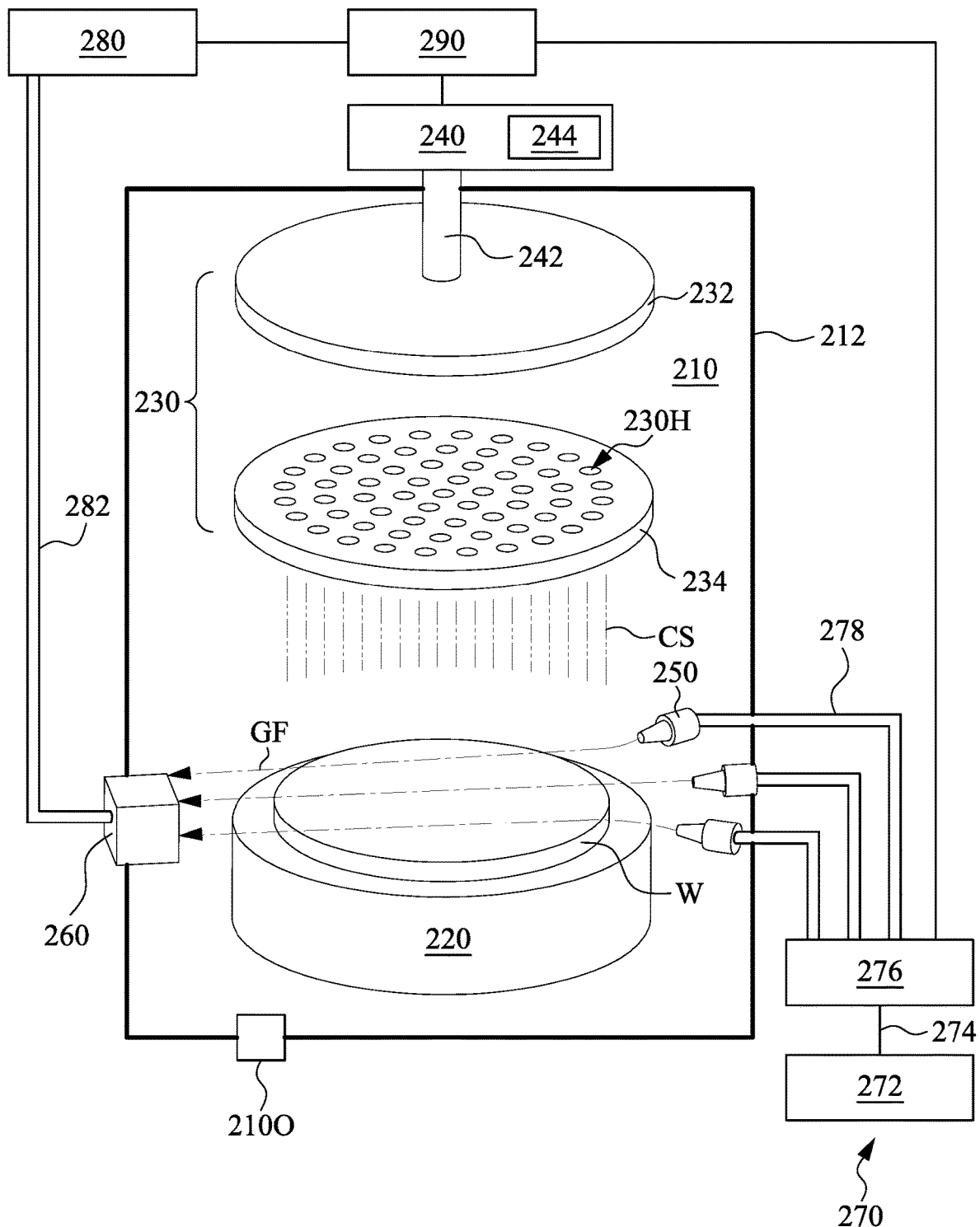
FIG. 12 is a schematic perspective view of a wet etch apparatus according to some embodiments of the present disclosure.
Figure 13:
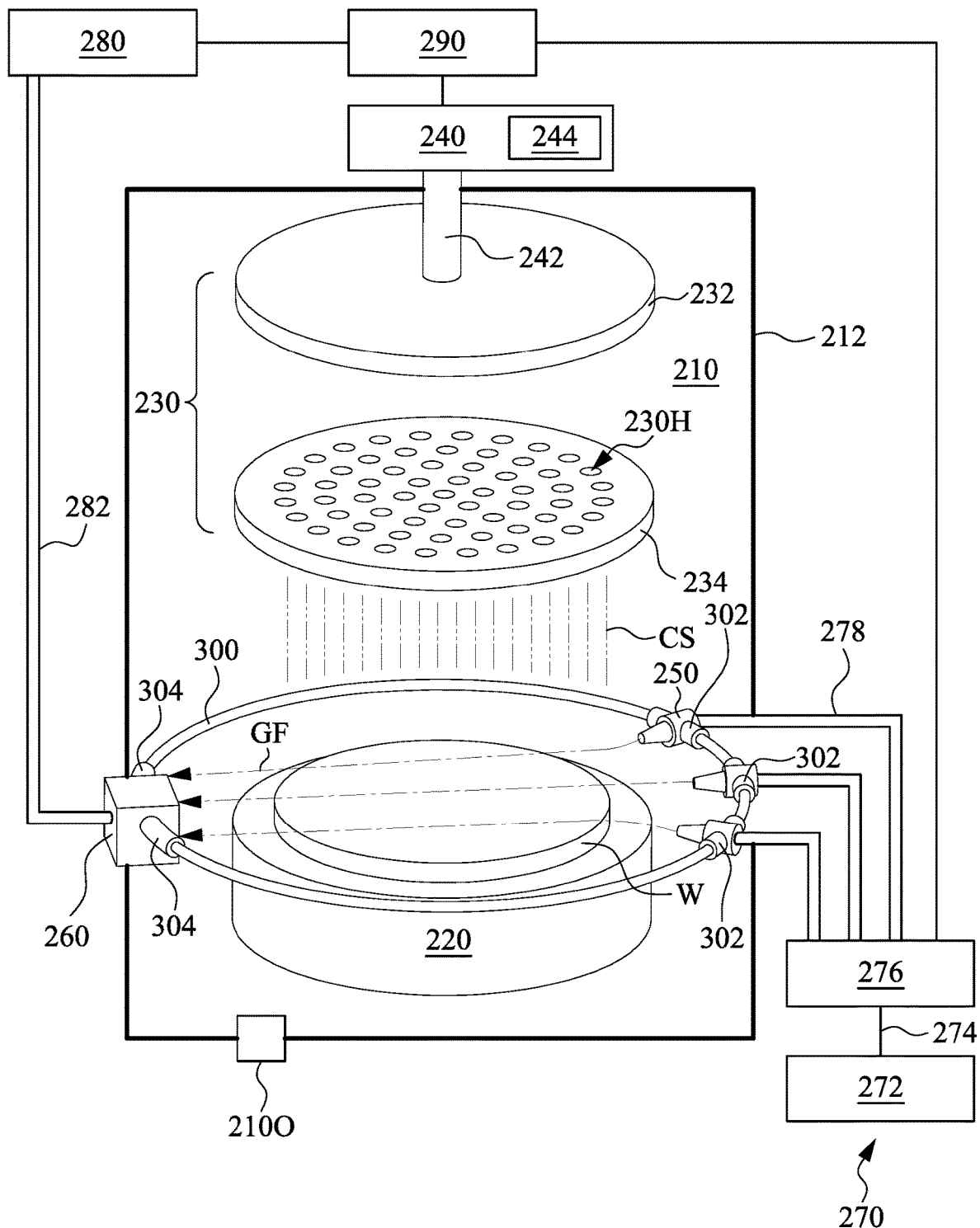
FIG. 13 is a schematic perspective view of a wet etch apparatus according to some embodiments of the present disclosure.
Figure 14:
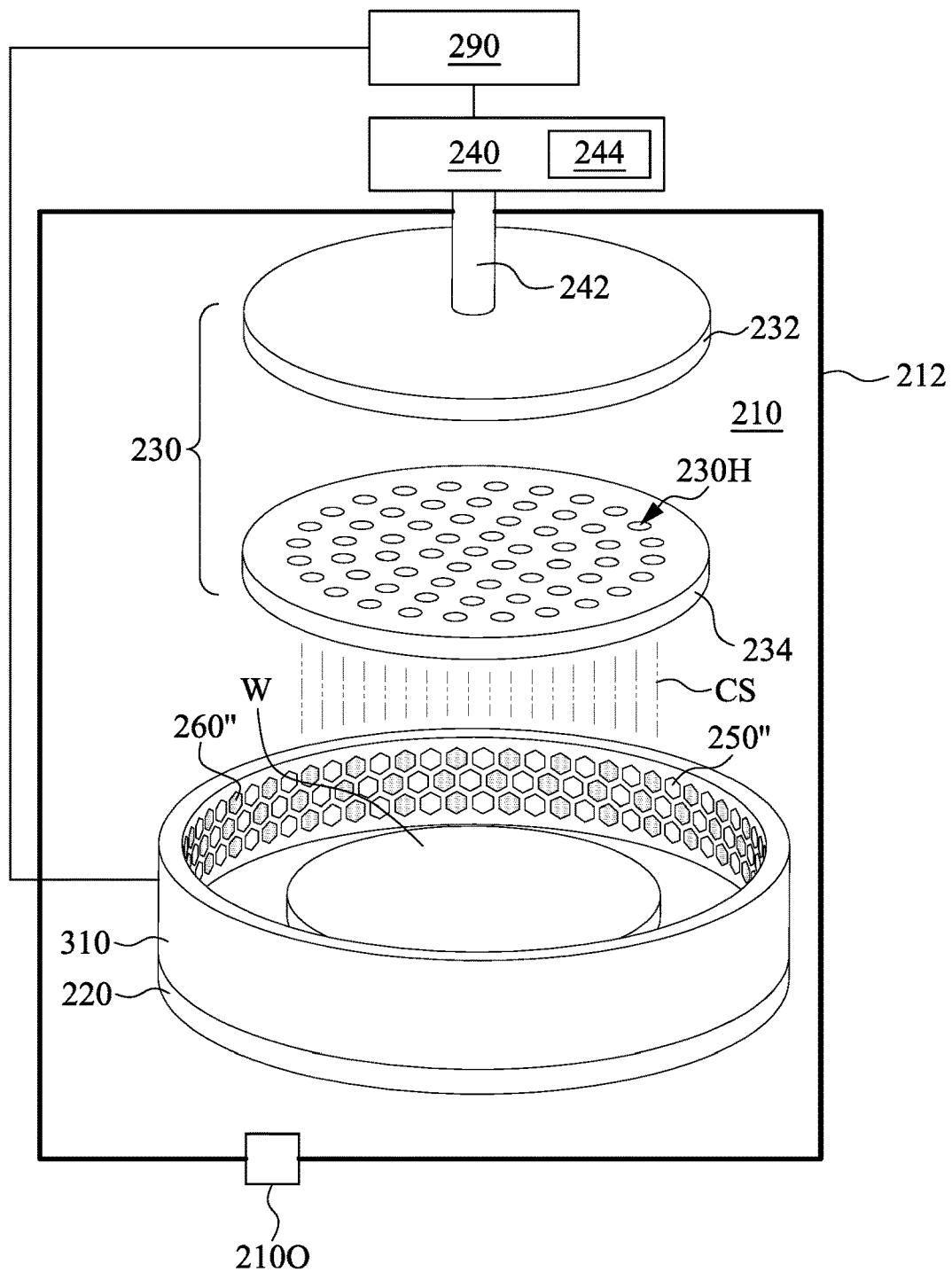
FIG. 14 is a schematic perspective view of a wet etch apparatus according to some embodiments of the present disclosure.

FIGS. 7-10 illustrate a dummy gate removal process using an etch process with improved etch directionality control in accordance with some embodiments. The etch process is performed to remove the dummy gate electrodes 140 (see FIGS. 6A and 6B), and thereby form plural gate trenches GT between the corresponding spacers 150. In some embodiments, a wet etch apparatus 200 as shown in FIG. 12, a wet etch apparatus 200' as shown in FIG. 13, or a wet etch apparatus 200" as shown in FIG. 14 can be used to perform the improved dummy gate removal process. For clear illustration, it is noted that the wafer W in FIGS. 12-14 may include the substrate 110 as shown in FIGS. 7-10, and the target structures of the wet etching are polysilicon gate electrodes on the wafer W.

Figure 7:
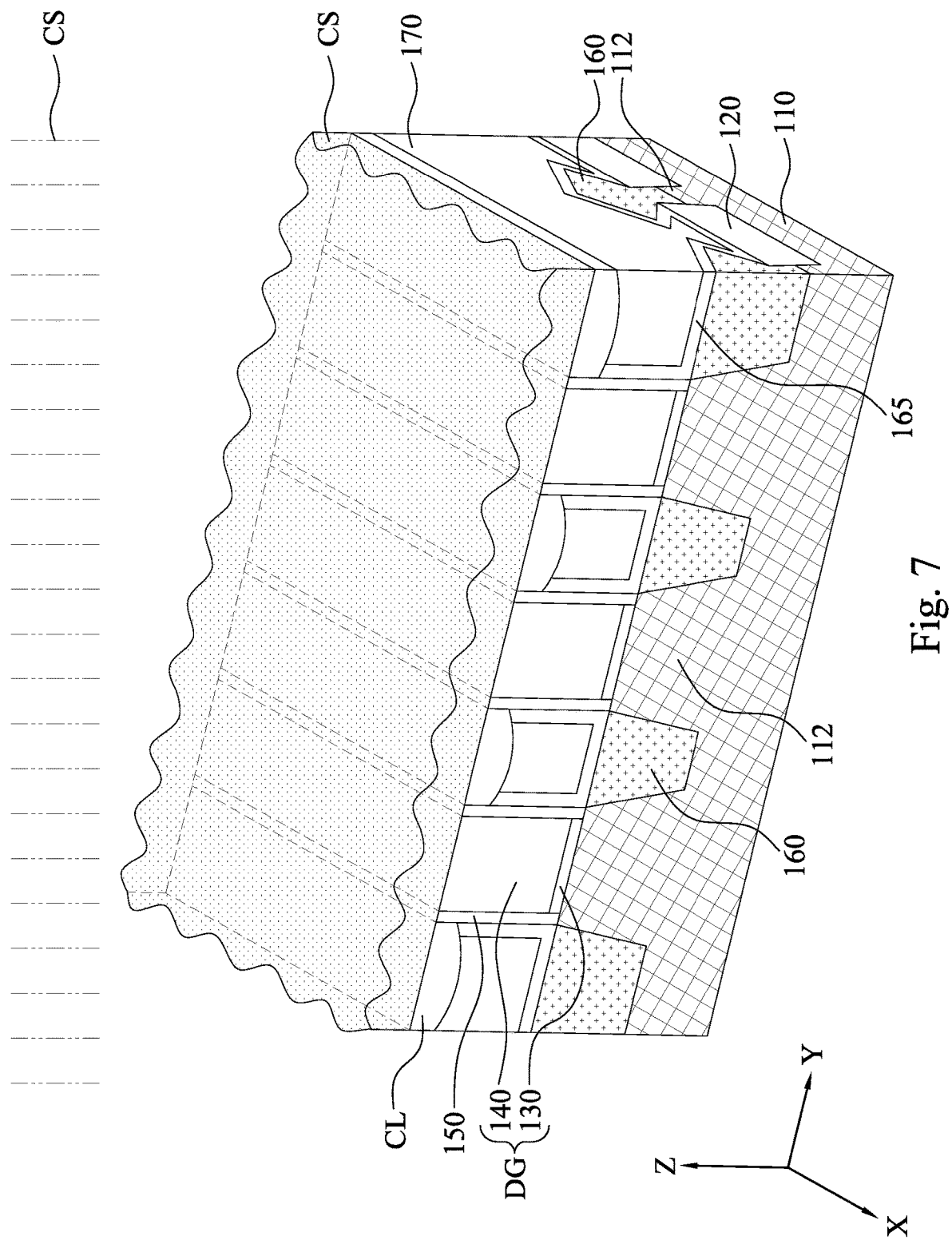

Referring to FIGS. 7 and 12, the wafer W including the substrate 110 is kept stationary during the wet etch process, and the chemical solution CS is spread onto the wafer W through a showerhead 230. Stated differently, the wafer W is free from a spin motion (i.e., free from rotation) during the wet etching process, so that the chemical solution CS on the wafer W will not experience a centrifugal motion, thus reducing the impact on the semiconductor fins 112. Moreover, although the absence of spin motion of the wafer W might lead to an increased challenge of uniformly spreading the chemical solution CS on the wafer W, the chemical solution CS can still be uniformly spread onto the entire surface of the wafer W by using the showerhead 230. For example, the showerhead 230 has dispensing holes 230H uniformly arranged (e.g., equidistantly arranged) to uniformly dispense the chemical solution CS on different regions. In this way, the chemical solution CS can be uniformly spread on the wafer W without rotating the wafer W.

In some embodiments, the liquid etchant in the chemical solution CS used to for etch the polysilicon (e.g., the dummy gate electrodes 140) may include hydrofluoric acid, a hydroxide containing solution (e.g., ammonium hydroxide), acetamide, tetramethylene sulfone, and/or other suitable etchant solutions. For example, HF, ammonium hydroxide ($NH_4OH$), and a mixture of the acetamide and tetramethylene sulfone may be applied on the substrate 110 in a sequence for removing polysilicon. The liquid etchants in the chemical solution CS may react with the dummy gate electrodes 140, and produce new reactants and byproducts in the chemical solution CS. In some embodiments, the capping layer CL that has higher etch resistance to the liquid etchant than that of the dummy gate electrodes 140, such that the ILD 170 below the capping layer CL remains substantially intact after the etch processes. In some embodiments, the gate spacers 150 have higher etch resistance to the liquid etchant than that of the dummy gate electrodes 140.

Figure 8:
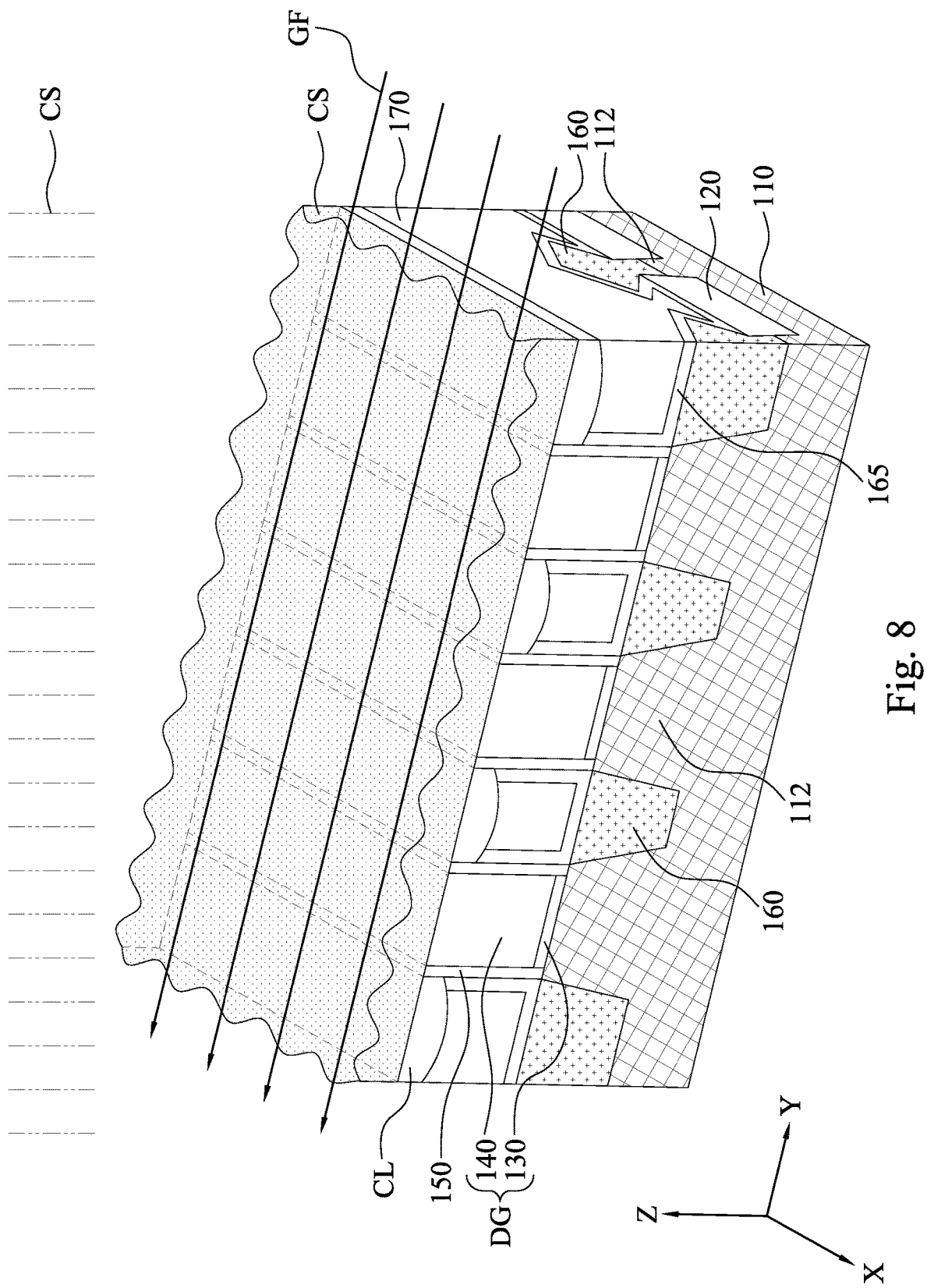

Referring to FIGS. 8 and 12, during dispensing the chemical solution CS, a gas flow GF is ejected from a gas ejector 250 to a gas extractor 260 to blow the chemical solution CS on the wafer W in a direction substantially parallel with longitudinal axes of the semiconductor fins 112 and perpendicular to longitudinal axes of the dummy gate electrodes 140 (i.e., the Y-direction as shown in FIG. 8), such that the chemical solution CS (including the liquid etchant and the byproduct) flows in a direction of the gas flow GF (i.e., in a direction substantially parallel with longitudinal axes of the semiconductor fins 112 and perpendicular to longitudinal axes of the dummy gate electrodes 140). As time passes, the dummy gate electrodes 140 will be removed by the reaction with liquid etchant in the chemical solution CS. In some embodiments, different chemical solutions CS may be used in a sequence for removing the dummy gate electrodes 140. For example, a HF solution CS may be first applied on the dummy gate electrodes 140, and the gas flow GF blows the HF solution CS in the Y-direction to form the gate trench GT. Subsequently, a $NH_4OH$ solution CS may be applied on the dummy gate electrodes 140, and the gas flow GF blows the $NH_4OH$ solution CS in the Y-direction to deepen the gate trench GT, in which the HF solution CS may be washed away by the $NH_4OH$ solution CS. Then, a chemical solution CS including a mixture of the acetamide and tetramethylene sulfone may be applied on the dummy gate electrodes 140, and the gas flow GF blows the chemical solution CS including a mixture of the acetamide and tetramethylene sulfone in the Y-direction to deepen the gate trench GT, in which the $NH_4OH$ solution CS may be washed away by the chemical solution CS including the mixture of the acetamide and tetramethylene sulfone. In the process, the gas flow GF is continuously ejected in the time span from blowing the HF solution CS to blowing the chemical solution CS including a mixture of the acetamide and tetramethylene sulfone. The resultant structure is shown in FIG. 9. The direction of the gas flow GF remains substantially constant during the etching the dummy gate electrodes 140, so as to control the chemical solution CS to flow in a desired direction. After the dummy gate electrodes 140 are etched away by the liquid etchant, the gas flow GF is turned off.

Because gas flow GF blows the chemical solution CS in the Y-direction, the flow of chemical solution CS can result in a higher etch rate in the Y-direction than in the X-direction (i.e., direction substantially perpendicular to the longitudinal axes of the semiconductor fins 112). Moreover, because the semiconductor fins 112 extend along the Y-direction which has a higher etch rate than X-direction, the sidewalls of the semiconductor fins 112 will experience a lower etch rate as compared to performing a wet etching process without using the gas flow GF on the fins 112. In this way, the impingement of the chemical solution CS on the sidewalls of the semiconductor fins 112 can be reduced, which in turn will prevent the source/drain features 160 from damages caused by the chemical solution CS. In some embodiments, the gas flow GF has a flow rate in a range from about 40 L/min to about 290 L/min. If the flow rate of the gas flow GF is greater than 290 L/min, the force of the gas flow GF may damage the patterns in the substrate 110 (e.g., the semiconductor fins 112), and may further result in the wafer breakage. If the flow rate of the gas flow GS is less than 40 L/min, reactants and byproducts in the chemical solution CS may remain on the substrate 110, and the etch result may not be uniform, which may result in under-etching or over-etching issues.

In the depicted embodiments, the chemical solution CS also removes the gate dielectric layers 130. In some other embodiments, the wet etching process is terminated before removing the gate dielectric layers 130, such that gate dielectric layers 130 remain at bottoms of the gate trenches GT. Time duration of the wet etching process (e.g., time duration of dispensing the chemical solution CS and/or time duration of blowing the chemical solution CS) may be performed using a time-mode, and may be stopped after the etching has been performed for a pre-set period of time. Other stop point detection techniques, however, are also contemplated.

Figure 10:
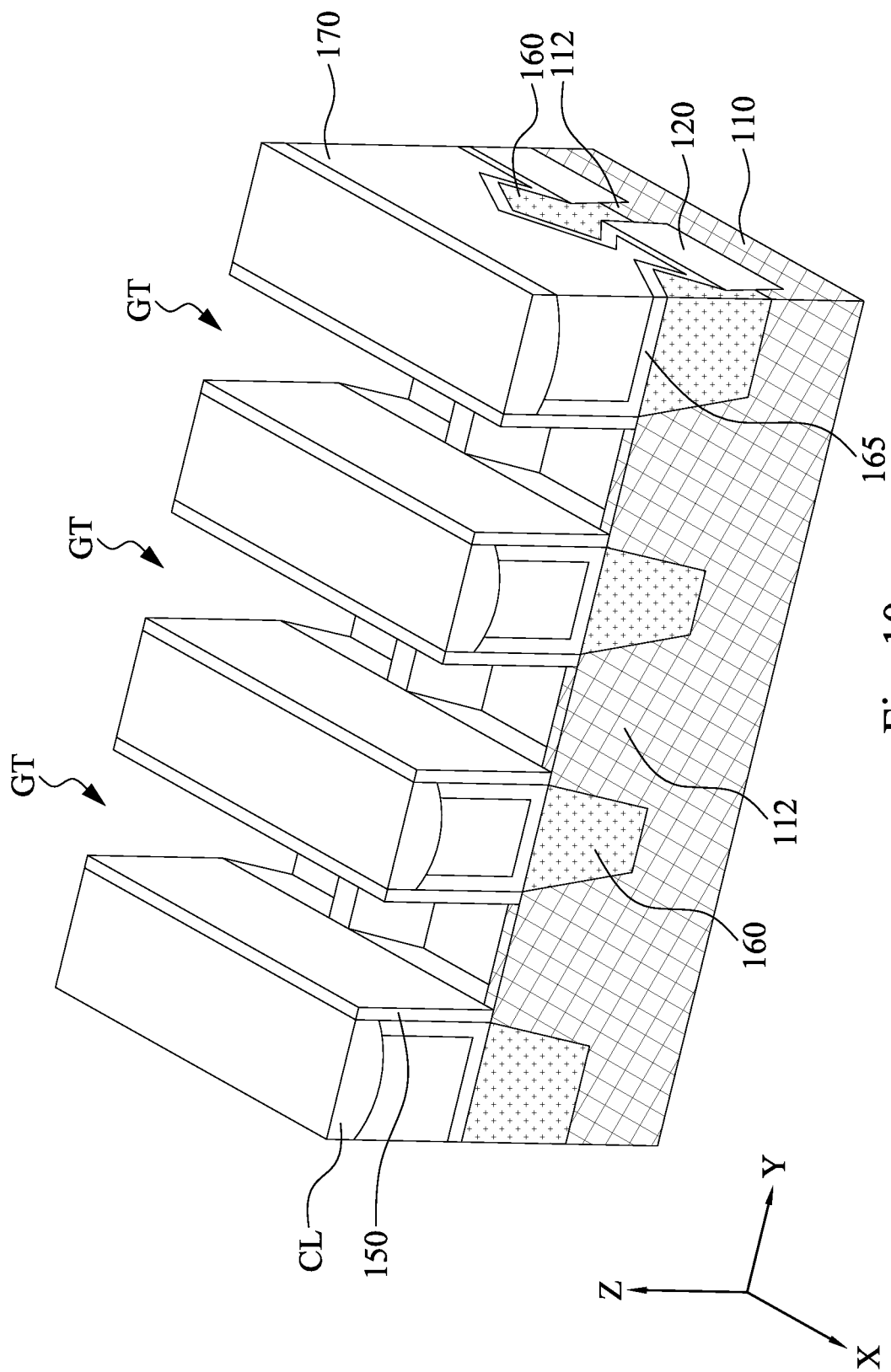

Referring to FIGS. 10 and 12, after the wet etching process, a cleaning agent may be applied onto the wafer W for removing the chemical solution CS from the wafer W, followed by a drying process performed to remove the cleaning agent, so that the gate trenches GT are exposed. Details of the wet etch apparatus 200 will be described subsequently with reference to FIG. 12.

Figure 11:
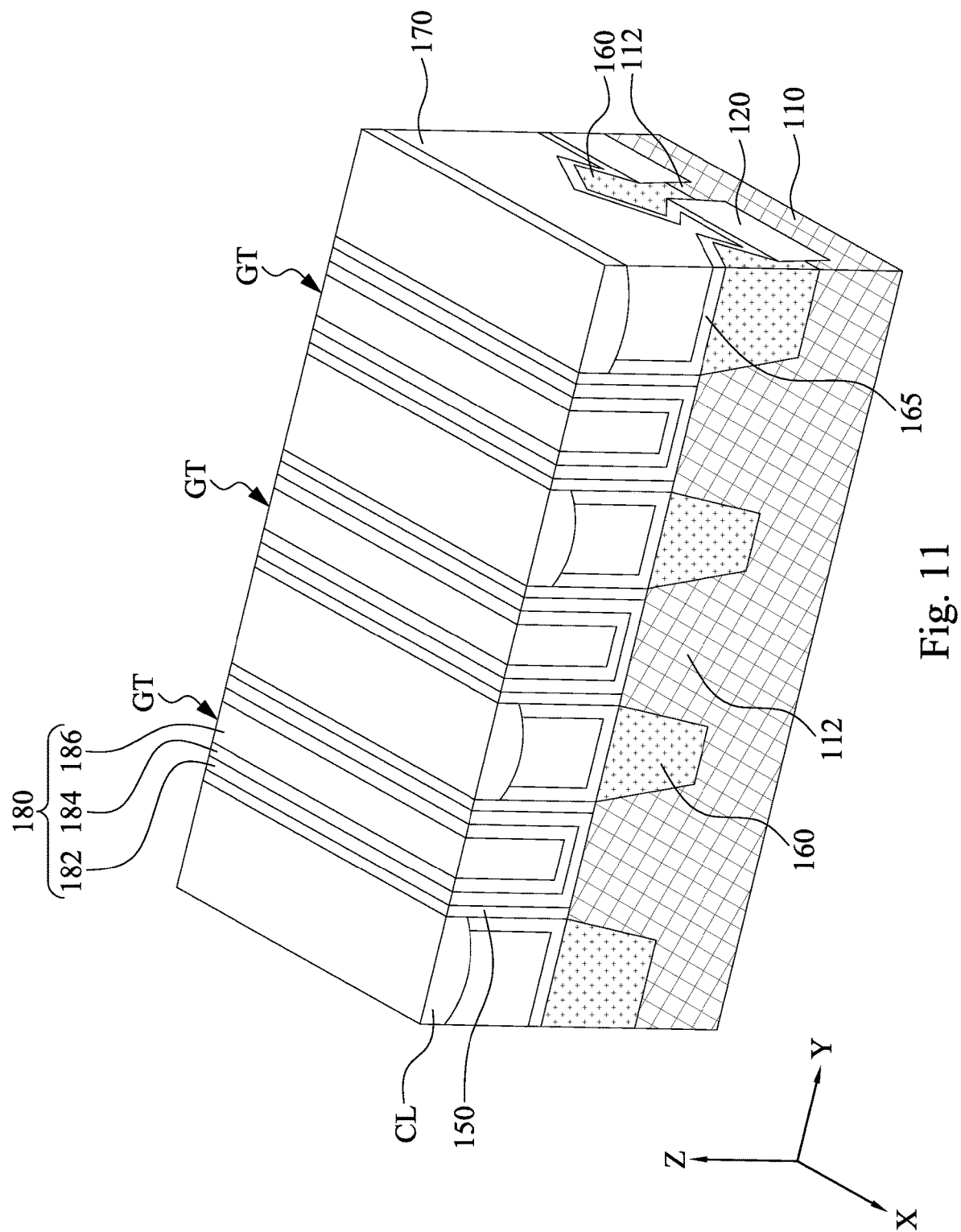

Reference is made to FIG. 11. High-k metal gate (HKMG) stacks 180 are formed respectively in the gate trenches GT. The HKMG stacks 180 each include a high-k dielectric layer 182, a work function metal layer 184 wrapped around by the high-k dielectric layer 182, and a fill metal layer 186 wrapped around by the work function metal layer 184. In some embodiments, the high-k dielectric layer 182 includes dielectric materials having a high dielectric constant, for example, greater than that of thermal silicon oxide (~3.9). The high-k dielectric layer 182 may include, for example, $HfO_2$, $TiO_2$, $HfZrO$, $Ta_2O3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, combinations thereof, or other suitable material. The high-k dielectric layer 182 may be formed by ALD, PVD, CVD, oxidation, and/or other suitable methods.

In some embodiments, the work function metal layer 184 may include an n-type and/or p-type work function metal layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer(s) may be deposited by CVD, PVD, electro-plating and/or another suitable process. The fill metal layer 186 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the HKMG stacks 180 may include depositing a blanket high-k dielectric layer, depositing one or more work function metal layers over the blanket high-k dielectric layer, forming a fill metal layer over the work function metal layers, and performing a CMP process to remove excessive materials of the fill metal layer, the work function metal layers and the high-k dielectric layer outside the gate trenches GT.

FIG. 12 is a schematic perspective view of a wet etch apparatus 200 according to some embodiments of the present disclosure. The wet etch apparatus 200 includes an etch chamber 210, a wafer chuck 220, a showerhead 230, a liquid etchant container 240, one or more gas ejectors 250, a gas extractor 260, a gas supply system 270, a gas exhaust pump 280, and a controller 290.

The chemical solution CS contained in the liquid etchant container 240 can be pumped to the etching chamber 210 using a pump 244 in the liquid etchant container 240. For example, the chemical solution CS is pumped from the liquid etchant container 240 to the showerhead 230 through a manifold 242 by the controller 290. The showerhead 230 then dispenses the chemical solution CS onto the wafer W in the etching chamber 210. In some embodiments, the showerhead 230 has a top plate 232 having a liquid inlet in fluid communication with the manifold 242 and a faceplate 234 having plural dispensing holes 230H uniformly arranged (e.g., equidistantly arranged) thereon, so as to dispense the chemical solution CS onto different regions of the wafer W uniformly. The showerhead 230 is illustrated in an exploded perspective view for the sake of clarity. During wet etching, the faceplate 234 is secured to a bottom of the top plate 232. In some embodiments, the etching chamber 210 has a fluid drain 210o for draining the chemical solution CS dropping from the wafer W.

In some embodiments, the etch chamber 210 may be surrounded by a housing 212 made of material that is inert to the etchant in the chemical solution CS. As such, the housing 212 may be any suitable material that can withstand the chemistries involved in the processes of the method of manufacturing a semiconductor device according to some embodiments. In some embodiments, the housing 212 may be steel, stainless steel, nickel, aluminum, alloys of these, combinations of these, and the like.

Within the etching chamber 210, the wafer W may be placed on the wafer chuck 220 during the etching process. The wafer chuck 220 may hold the wafer W using a vacuum suction force, and may optionally include heating mechanisms (not shown) in order to heat the wafer W during the etching process. In some embodiments, the wafer W is kept stationary by using the vacuum suction force of the wafer chuck 220. More particularly, the wafer chuck 220 holding the wafer W is free from rotation during the wet etching process. In this way, the chemical solution CS dispensed on the wafer W can be free from a centrifugal motion. The wafer chuck 220 is made of material that is inert to the etchant in the chemical solution CS. As such, the wafer chuck 220 may be any suitable material that can withstand the chemistries involved in the processes of the method of manufacturing a semiconductor device according to some embodiments. In some embodiments, the wafer chuck 220 may be steel, stainless steel, nickel, aluminum, alloys of these, combinations of these, and the like.

The gas ejector 250 is configured for introducing a gas flow GF to the etching chamber 210. For example, herein, the gas ejector 250 is connected with a gas supply system 270. The gas supply system 270 may supply a gas that is an inert gas or other gases that do not react with the etchant in the chemical solution CS, materials on the wafer W (e.g., semiconductor fins 112, polysilicon of dummy gate electrodes 140, or silicon oxide of the ILD layer 170), or by-products from the etchant's reaction with features on the wafer W (e.g., polysilicon). In some embodiments, the gas is free from carbon dioxide, which may react with the chemical solution CS and result in unwanted residues on the substrate 110. For example, the gas may be nitrogen ($N_2$), a noble gas (e.g., helium (He), argon (Ar)), combinations of these, or the like, although other suitable gases may alternatively be utilized. In some embodiments, the gas may be a pure gas having a single element, such as $N_2$, He, or Ar. In some embodiments, the gas may be a gas mixture having plural elements, such as combinations of $N_2$ gas, He gas, and Ar gas. In some embodiments, the gas ejectors 250 may include nozzles.

In some embodiments, the gas supply system 270 includes a gas source 272, a first gas line 274, a valve 276, and second gas lines 278. The gas source 272 may be a vessel, such as a gas storage tank, which is located locally to the etching chamber 210 or remotely located from the etching chamber 210. Any suitable source for the gas may be utilized as the gas source 272. The gas source 272 may supply the gas to the valve 276 through the first gas line 274. The valve 276 may be utilized to control the flow rate of the gas to the gas ejector 250 through the second gas lines 278. The valve 276 may also turn on/off the gas flow from the first gas line 274 to the second gas lines 278 in some embodiments. The valve 276 may be, e.g., a proportional valve, a modulating valve, a needle valve, a pressure regulator, a mass flow controller, combinations of these, or the like.

The gas extractor 260 is configured for exhausting the gas flow GF. For example, the gas extractor 260 is connected with the gas exhaust pump 280 outside the etching chamber 210. The gas exhaust pump 280 may include a conduit 282 in gas communication with the gas extractor 260 in the chamber 210. In some embodiments, the gas ejector 250 and the gas extractor 260 are respectively at first and second positions not vertically overlapping the wafer W and are respectively disposed on opposite sides of the wafer W, such that the gas flow GF blows across the wafer W. The first position of the gas ejector 250 may be spaced apart from the second position of the gas extractor 260 along a direction substantially perpendicular to a longitudinal axis of the target structure (e.g., the dummy gate electrode 140 as shown in FIG. 8), such that the gas flow GF is substantially perpendicular to the longitudinal axis of the target structure. The controller 290 may be electrically connected to the valve 276 of the gas supply system 270, the gas exhaust pump 280, and the liquid etchant container 240, so as to control the steps of dispensing chemical solution CS and generating gas flow GF.

FIG. 13 is a schematic perspective view of a wet etch apparatus 200' according to some embodiments of the present disclosure. The wet etch apparatus 200' is similar to the wet etch apparatus 200 as shown in FIG. 12, and at least one difference between the wet etch apparatus 200' and the wet etch apparatus 200 as shown in FIG. 12 is that the gas ejectors 250 and the gas extractor 260 are movable. For example, the wet etch apparatus 200' further includes vehicles 302 and 304 movably coupled to a guide rail 300, and the gas ejectors 250 and the gas extractor 260 are respectively disposed on the vehicles 302 and 304. The guide rail 300 may have a circular shape. The vehicles 302 and 304 may be electrically connected with the controller 290. By moving the vehicles 302 and 304, the position of the gas ejectors 250 and the gas extractor 260 may be adjusted. Through such a configuration, in some embodiments, prior to generating a gas flow across the wafer (e.g., turning on the valve 276), the positions of the gas ejectors 250 and the gas extractor 260 may be adjusted according to the orientations of the semiconductor fins 112 and the dummy gate electrode 140 (as shown in FIGS. 8 and 9). For example, the gas ejectors 250 are spaced apart from the gas extractor 260 in a direction substantially parallel with longitudinal axes of the semiconductor fins 112 and perpendicular to longitudinal axes of the dummy gate electrode 140. In some embodiments, the gas ejectors 250 and the gas extractor 260 are moved to the positions not vertically overlapping the wafer W, such that the gas flow GF blows across the wafer W. Other details of the wet etch apparatus 200' are similar to those of the wet etch apparatus 200 as shown in FIG. 12, and therefore not repeated herein.

FIG. 14 is a schematic perspective view of a wet etch apparatus 200" according to some embodiments of the present disclosure. The wet etch apparatus 200" is similar to the wet etch apparatus 200 as shown in FIG. 12, and at least one difference between the wet etch apparatus 200" and the wet etch apparatus 200 as shown in FIG. 12 is that the wet etch apparatus 200" includes gas ejectors 250" and gas extractors 260" disposed on a wall 310 that surrounds the wafer W. The wall 310 may be supported by the wafer chuck 220. The wall 310 is made of material that is inert to the etchant in the chemical solution CS. As such, the wall 310 may be any suitable material that can withstand the chemistries involved in the processes of the method of manufacturing a semiconductor device according to some embodiments. In some embodiments, the wall 310 may be steel, stainless steel, nickel, aluminum, alloys of these, combinations of these, and the like. The controller 290 is electrically connected with the gas ejectors 250" and the gas extractors 260" for controlling individual gas ejectors 250" and individual gas extractors 260", so as to generate the gas flow in a desired direction. For example, a first group of the gas ejectors 250 closest to first ends of the fins 112 (as shown in FIG. 9) are turned on, a first group of the gas extractors 260 closest to the first ends of the fins 112 are turned off, a second group of the gas ejectors 250 furthest from the first ends of the fins 112 (i.e., closest to second ends of the fins 112 that are opposite the first ends) are turned off, and a second group of the gas extractors 260 furthest from the first ends of the fins 112 are turned on, such that gas may flow from the first ends of the fins 112 to the second ends of the fins 112 (i.e., flow along a direction parallel with the longitudinal axes of the semiconductor fins 112).

In some embodiments, the gas ejectors 250 and the gas extractors 260 have hexagonal contours on the wall 310 for increasing the number of the gas ejectors 250 and the gas extractors 260. In some embodiments, the wall 310 is a ring-shaped wall that encircles the wafer W and may be concentrically disposed on the wafer chuck 220. In greater detail, the wall 310 may have substantially the same top-view contour as the circular wafer W. In some embodiments where the wafer chuck 220 is free from rotation during dispensing the chemical solution, the wall 310 is free from rotation as well. Other details of the wet etch apparatus 200" are similar to those of the wet etch apparatus 200 as shown in FIG. 12, and therefore not repeated herein.

Figure 15:
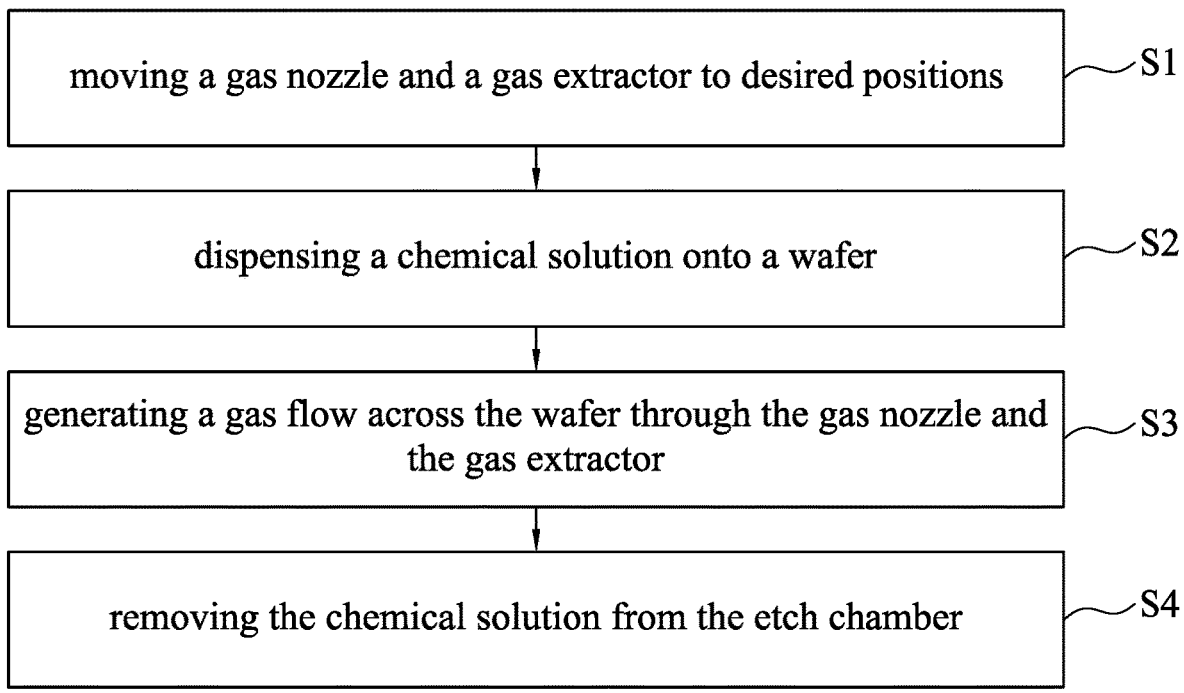
FIG. 15 is a flow chart of a wet etching method according to some embodiments of the present embodiments.

FIG. 15 is a flow chart of a wet etching method M according to some embodiments of the present embodiments. The method M includes steps S1-S4, in which the wet etch apparatus 200' in FIG. 13 is exemplarily used herein. The illustration is merely exemplary and is not intended to limit beyond what is specifically recited in the claims that follow. It is understood that additional operations may be provided before, during, and after the steps shown by FIG. 15, and some of the steps described below can be replaced or eliminated for additional embodiments of the method. The order of the operations/processes may be interchangeable.

Reference is made to FIGS. 13 and 15. At step S1, the controller 290 may control the vehicles 302 and 304 to move the gas ejectors 250 and the gas extractor 260 along the guide rail 300 to desired positions according to the orientations of the semiconductor fins on the wafer. For example, the vehicles 302 and 304 are moved such that the gas ejectors 250 are spaced apart from the gas extractor 260 along a direction substantially parallel with longitudinal axes of the semiconductor fins. In some embodiments where the gas ejectors 250 and the gas extractor 260 are not movable as illustrated in FIG. 12, step S1 can be skipped.

At step S2, the controller 290 may turn on the pump 244 in the liquid etchant container 240 to pump the chemical solution CS to the showerhead 230, so that the showerhead 230 dispenses the chemical solution CS onto the wafer W.

At step S3, a gas flow is generated across the wafer W for blowing the chemical solution CS, and the dummy gate electrodes are etched and removed by the blown liquid etchant in the blown chemical solution CS. For example, the controller 290 may turn on the valve 276, thus allowing the gas ejector 250 to eject a gas flow to a first side the wafer W (e.g., right side of the wafer W). Moreover, the controller 290 may turn on the gas exhaust pump 280, thus allowing the gas extractor 260 to exhaust the gas flow from a second side of the wafer W (e.g., left side of the wafer W). In some embodiments, after moving the gas ejector 250 and the gas extractor 260 to the desired position and turning on the gas ejector 250 and the gas extractor 260, the gas ejector 250 and the gas extractor 260 are kept stationary during dispensing the chemical solution CS, and thus the gas flow is fixed in the same direction during dispensing the chemical solution CS. That is, the direction of the gas flow remains substantially constant during dispensing the chemical solution CS. In some embodiments, the gas flow is generated (e.g., by turning on the valve 276) when the chemical solution CS is dispensed onto the wafer W (e.g., by turning on the pump 244). Stated differently, the turn-on operation of the valve 276 is synchronously performed with the turn-on operation of the pump 244. In some other embodiments, the gas flow is generated after the chemical solution CS is dispensed onto the wafer W. Stated differently, the turn-on operation of the valve 276 is asynchronously performed with the turn-on operation of the pump 244, and more particularly, the turn-on operation of the valve 276 is performed after the turn-on operation of the pump 244. Afterwards, dispensing the chemical solution CS is terminated (e.g., by turning off the pump 244) to stop the etching process. In some embodiments, the gas flow is stopped (e.g., by turning off the valve 276) after stopping dispensing the chemical solution CS onto the wafer W. Stated differently, the turn-off operation of the valve 276 is asynchronously performed with the turn-off operation of the pump 244, and more particularly, the turn-off operation of the valve 276 is performed after the turn-off operation of the pump 244.

After the etching process, at step S4, the chemical solution CS is removed from the etch chamber 210 through the fluid drain 2100 by a cleaning process. In the cleaning process, a cleaning agent may be applied onto the wafer W for removing the chemical solution CS from the wafer W and the etch chamber 210. In some embodiments, the gas ejector 250 may keep ejecting the gas flow during the cleaning process, and the gas extractor 260 may keep exhausting the gas during the cleaning process. In this way, potential damages to the semiconductor fins 112 caused by the cleaning agent can be reduced. In such embodiments, the gas flow is stopped (e.g., by turning off the valve 276) after stopping applying the cleaning agent onto the wafer W. In some other embodiments, the gas ejector 250 may stop ejecting the gas flow, and the gas extractor 260 may stop exhausting the gas before the cleaning process, and thus the cleaning process may be performed without the gas flow. In such embodiments, the gas flow is stopped (e.g., by turning off the valve 276) before stopping applying the cleaning agent onto the wafer W. After the cleaning process, a drying process may be performed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by generating a gas flow across the wafer during wet etching, a direction of the flow of the chemical solution can be controlled. Another advantage is that during the wet etching, the chemical solution can be uniformly spread on the wafer even if the wafer is free from rotation. Yet another advantage is reduction of impact of the dummy gate removal process on the semiconductor fins, because the chemical solution used in the dummy gate removal process is blown in the direction parallel with longitudinal axes of the semiconductor fins.

According to some embodiments of the present disclosure, a method includes dispensing a liquid etchant onto a wafer, wherein the wafer is free from rotation during dispensing the liquid etchant; blowing the liquid etchant on the wafer using a gas flow, wherein a direction of the gas flow remains substantially constant during dispensing the liquid etchant; and turning the gas flow off after a target structure on the wafer is etched away by the liquid etchant.

According to some embodiments of the present disclosure, a method includes forming a semiconductor fin on a substrate and extending in a first direction; forming a dummy gate stack across the semiconductor fin and extending in a second direction; forming a plurality of gate spacers respectively on opposite sides of the dummy gate stack; applying a liquid etchant on the dummy gate stack and blowing the liquid etchant using a gas flow in the first direction to form a gate trench between the gate spacers; and forming a metal gate structure in the gate trench.

According to some embodiments of the present disclosure, a wet etch apparatus includes a wafer chuck, a showerhead, a liquid etchant, a gas ejector, and a gas extractor. The showerhead has plural dispensing holes above the wafer chuck. The liquid etchant container is in fluid communication with the dispensing holes of the showerhead. The gas ejector and the gas extractor are respectively disposed on opposite sides of the wafer chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor fin on a substrate and extending in a first direction;
    forming a dummy gate stack across the semiconductor fin and extending in a second direction;
    forming a plurality of gate spacers respectively on opposite sides of the dummy gate stack;
    applying a first liquid etchant on the dummy gate stack and blowing the first liquid etchant using a gas flow in the first direction to form a gate trench between the gate spacers; and
    forming a metal gate structure in the gate trench.

2. The method of claim 1, wherein the gas flow is a pure gas.

3. The method of claim 1, further comprising:
    applying a second liquid etchant on the dummy gate stack and blowing the second liquid etchant using the gas flow in the first direction to deepen the gate trench prior to forming the metal gate structure in the gate trench.

4. The method of claim 3, wherein the gas flow is continuously ejected in a time span from blowing the first liquid etchant to blowing the second liquid etchant.

5. The method of claim 1, wherein the gas flow is fixed in the first direction during blowing the first liquid etchant etching the dummy gate stack.

6. The method of claim 1, further comprising:
    moving a gas ejector and a gas extractor to a first position and a second position, respectively, wherein the first position is spaced apart from the second position along the first direction, and blowing the first liquid etchant comprises ejecting the gas flow from the gas ejector to the gas extractor after moving the gas ejector and the gas extractor.

7. The method of claim 1, wherein blowing the first liquid etchant comprises:
    turning on a first gas ejector closest to an end of the semiconductor fin;
    turning off a first gas extractor closest to the end of the semiconductor fin;
    turning off a second gas ejector furthest from the end of the semiconductor fin; and
    turning on a second gas extractor furthest from the end of the semiconductor fin.

8. A method, comprising:
    forming a semiconductor fin on a substrate and extending in a first direction;
    forming a dummy gate stack across a first portion of the semiconductor fin and extending in a second direction;
    forming a source/drain feature over a second portion of the semiconductor fin;
    forming an interlayer dielectric layer surrounding the dummy gate stack and the source/drain feature;
    removing the dummy gate stack to form a gate trench in the interlayer dielectric layer, wherein removing the dummy gate stack comprises:
        dispensing a liquid etchant onto the substrate; and
        blowing the liquid etchant on the substrate using a gas flow; and
    forming a metal gate structure in the gate trench.

9. The method of claim 8, wherein a direction of the gas flow remains substantially constant during dispensing the liquid etchant.

10. The method of claim 8, wherein removing the dummy gate stack further comprises:
    turning the gas flow off after the dummy gate stack on the substrate is etched away by the liquid etchant.

11. The method of claim 8, further comprising:
    recessing the interlayer dielectric layer; and
    forming a capping layer over the recessed interlayer dielectric layer prior to removing the dummy gate stack.

12. The method of claim 11, wherein dispensing the liquid etchant onto the substrate is performed such that a top surface of the recessed interlayer dielectric layer is spaced apart from the liquid etchant by the capping layer.

13. The method of claim 8, further comprising:
    dispensing a cleaning agent onto the substrate after removing the dummy gate stack; and
    blowing the cleaning agent on the substrate using the gas flow.

14. The method of claim 8, wherein the substrate is free from rotation during dispensing the liquid etchant.

15. A method, comprising:
    forming a dummy gate stack over a substrate;
    forming a plurality of gate spacers respectively on opposite sides of the dummy gate stack;
    removing the dummy gate stack to form a gate trench between the gate spacers, wherein removing the dummy gate stack comprises:

dispensing a liquid etchant onto the substrate, wherein the substrate is free from rotation during dispensing the liquid etchant; and blowing the liquid etchant on the substrate using a gas flow; and forming a metal gate structure in the gate trench.

16. The method of claim 15, wherein blowing the liquid etchant comprises ejecting the gas flow from a gas ejector at a first position not vertically overlapping the substrate.

17. The method of claim 16, wherein blowing the liquid etchant further comprises exhausting the gas flow through a gas extractor at a second position not vertically overlapping the substrate.

18. The method of claim 17, wherein the first position is spaced apart from the second position along a direction substantially perpendicular to a longitudinal axis of the dummy gate stack.

19. The method of claim 15, wherein the liquid etchant is dispensed through a plurality of dispensing holes on a showerhead.

20. The method of claim 19, wherein the dispensing holes are substantially equidistantly arranged on the showerhead.

* * * * *